United States Patent
Akiyama et al.

(10) Patent No.: US 10,228,412 B2
(45) Date of Patent: Mar. 12, 2019

(54) SEMICONDUCTOR DEVICE AND METHOD FOR TESTING SAME

(71) Applicant: Mitsubishi Electric Corporation, Tokyo (JP)

(72) Inventors: Hajime Akiyama, Tokyo (JP); Akira Okada, Tokyo (JP); Kinya Yamashita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/110,768

(22) PCT Filed: Mar. 6, 2014

(86) PCT No.: PCT/JP2014/055719
§ 371 (c)(1),
(2) Date: Jul. 11, 2016

(87) PCT Pub. No.: WO2015/132926
PCT Pub. Date: Sep. 11, 2015

(65) Prior Publication Data
US 2016/0334458 A1    Nov. 17, 2016

(51) Int. Cl.
*G01R 31/26* (2014.01)
*H01L 21/66* (2006.01)
(Continued)

(52) U.S. Cl.
CPC ......... *G01R 31/2644* (2013.01); *G01R 31/44* (2013.01); *H01L 22/14* (2013.01);
(Continued)

(58) Field of Classification Search
CPC ..... G01R 31/2644; H01L 22/14; H01L 22/32; H01L 22/34; H01L 23/3192; H01L 23/528; H01L 23/53271; H01L 29/45
(Continued)

(56) References Cited

U.S. PATENT DOCUMENTS 7,847,298 B2 *  12/2010  Ogihara ............... G03G 15/326
                                                                257/79
7,944,059 B2     5/2011  Nagai et al.
(Continued)

FOREIGN PATENT DOCUMENTS

CN         1835256 A     9/2006
CN       101399286 A     4/2009
(Continued)

OTHER PUBLICATIONS

An Office Action issued by the Korean Patent Office dated Sep. 19, 2017, which corresponds to Korean Patent Application 10-2016-7023988 and is related to U.S. Appl. No. 15/110,768.
(Continued)

*Primary Examiner* — Melissa Koval
*Assistant Examiner* — Trung Nguyen
(74) *Attorney, Agent, or Firm* — Studebaker & Brackett PC (57) ABSTRACT

A purpose of the present invention is to provide a technique capable of suppressing an electric discharge during evaluation. A semiconductor device includes: a semiconductor base body having an element region and a terminal region; a plurality of electrode pads disposed in an area that is in the element region of the semiconductor base body and is separated from the terminal region, an insulating protection film having an opening provided above each of the electrode pads; and a plurality of conductive layers disposed on the protection film and electrically connected to the plurality of electrode pads, respectively, through the opening. In a planar view, each of the conductive layers is extended to the terminal region or the vicinity of the terminal region.

15 Claims, 6 Drawing Sheets

(51) Int. Cl.
  *H01L 23/528* (2006.01)
  *H01L 23/532* (2006.01)
  *H01L 29/45* (2006.01)
  *H01L 23/31* (2006.01)
  *G01R 31/44* (2006.01)
  *H01L 29/417* (2006.01)
  *H01L 29/739* (2006.01)

(52) U.S. Cl.
  CPC .............. *H01L 22/32* (2013.01); *H01L 22/34* (2013.01); *H01L 23/3192* (2013.01); *H01L 23/528* (2013.01); *H01L 23/53271* (2013.01); *H01L 29/417* (2013.01); *H01L 29/45* (2013.01); *H01L 29/7395* (2013.01)

(58) Field of Classification Search
  USPC ...... 324/754.01–754.03, 500, 754.07, 754.1, 324/754.11, 754.21, 755.01, 755.11, 324/756.03, 758.01, 690, 696
  See application file for complete search history.

(56) References Cited

U.S. PATENT DOCUMENTS

| | | | |
|---|---|---|---|
| 9,222,970 | B2 | 12/2015 | Suzuki et al. |
| 2001/0035554 | A1* | 11/2001 | Yamauchi ........... H01L 27/0629 257/340 |
| 2005/0048695 | A1* | 3/2005 | Chia .................. H01L 23/3114 438/106 |
| 2006/0197102 | A1 | 9/2006 | Ogihara et al. |
| 2007/0052085 | A1 | 3/2007 | Nagai et al. |
| 2008/0042275 | A1 | 2/2008 | Kuan et al. |
| 2009/0096030 | A1* | 4/2009 | Ishida ................. H01L 29/0634 257/368 |
| 2010/0044770 | A1 | 2/2010 | Lee |
| 2011/0049728 | A1 | 3/2011 | Pagani |
| 2011/0215481 | A1 | 9/2011 | Nagai et al. |
| 2014/0361430 | A1* | 12/2014 | Ono .................. H01L 23/49811 257/737 |
| 2015/0380541 | A1* | 12/2015 | Arai .................... H01L 29/7802 257/77 |

FOREIGN PATENT DOCUMENTS

| | | |
|---|---|---|
| JP | 08-162429 A | 6/1996 |
| JP | 10-096746 A | 4/1998 |
| JP | 2003-130889 A | 5/2003 |
| JP | 2003-249558 A | 9/2003 |
| JP | 2007-048853 A | 2/2007 |
| JP | 2009-218264 A | 9/2009 |
| JP | 2010-050450 A | 3/2010 |
| JP | 2013-101009 A | 5/2013 |
| JP | 2013-118213 A | 6/2013 |

OTHER PUBLICATIONS

An Office Action and Search Report issued by the Chinese Patent Office dated Apr. 4, 2018, which corresponds to Chinese Patent Application No. 201480076889.X and is related to U.S. Appl. No. 15/110,768; with English Translation.

International Preliminary Report on Patentability: PCT/JP2014/055719 dated Sep. 15, 2016, with English Translation.

International Search Report: PCT/JP2014/055719 dated Apr. 28, 2014.

An Office Action; "Notification of Reason(s) for Refusal" issued by the Japanese Patent Office dated Nov. 8, 2016, which corresponds to Japanese Patent Application No. 2016-506032 and is related to U.S. Appl. No. 15/110,768; with English language partial translation.

* cited by examiner

SEMICONDUCTOR DEVICE AND METHOD FOR TESTING SAME

TECHNICAL FIELD

The present invention relates to a semiconductor device provided with an electrode pad, and a method for testing the semiconductor device by inputting and outputting electricity to and from the electrode pad to evaluate the electrical characteristic of the semiconductor device.

BACKGROUND ART

A test method is known, in which a contact probe is brought into contact with an electrode pad of an object to be measured such as a semiconductor wafer or a semiconductor device, and then electricity is input to and output from the electrode pad to evaluate the electrical characteristic of the object to be measured. In recent years, in response to demands for high current and high voltage application of the electricity to be input to and output from the electrode pad, the number of pins of the contact probes has been increased.

However, due to the increased pins, a partial electric discharge phenomenon may occur, for example, between a contact probe and an object to be measured or between the contact probes during evaluation of the object to be measured. This phenomenon causes partial damage or malfunction of the object to be measured in some cases. If occurrence of a partial electric discharge is overlooked and the measured object with damage or the like caused by a partial electric discharge is sent to a subsequent process as a non-defective product, finding the measured object is extremely difficult in the subsequent process. Hence, techniques to restrain the partial electric discharge during the evaluation of the measured object are demanded.

For example, Patent Documents 1 and 2 propose techniques to restrain the partial electric discharge. Further, in recent years, failure analyses are proposed in which damage or the like is detected on the upper or lower surface of the object to be measured during the electrical evaluation by use of the OBIRCH method using infrared radiation to metal, the photo emission microscopic method using light emission detection, an infrared spectroscopic technique, or other methods (for example, Patent Documents 3 and 4).

PRIOR ART DOCUMENTS

Patent Documents

Patent Document 1: Japanese Patent Application Laid-Open No. 2003-130889
Patent Document 2: Japanese Patent Application Laid-Open No. 10-96746 (1998)
Patent Document 3: Japanese Patent Application Laid-Open No. 2013-101009
Patent Document 4: Japanese Patent Application Laid-Open No. 2013-118213

SUMMARY OF INVENTION

Problems to be Solved by the Invention

In the technique, as disclosed in Patent Document 1, for conducting an inspection in an insulating liquid, the electric discharge occurring during the characteristic inspection of electronic components can be suppressed. However, disadvantageously, this technique requires an expensive prober, and in addition, involves increased time for an evaluation process because evaluation is performed in a liquid, and thus this technique is not suitable for cost reduction. Further, when the objects to be measured are semiconductor elements under the wafer test or chip test, the complete removal of insulating liquid from the semiconductor element after the evaluation is difficult.

Further, in the technique, as disclosed in Patent Document 2, for conducting an inspection in a closed space filled with an inert gas, the discharge occurring during the characteristic inspection of electronic components can be suppressed. However, disadvantageously, this technique involves a complicated configuration of the evaluation apparatus and is not suitable for cost reduction, and also involves increased time for an evaluation process.

Further, when a semiconductor device such as a power semiconductor element is observed by use of the OBIRCH method, since a metal film is formed on the front surface of the ordinary semiconductor device, creation of an apparatus is necessary, which is capable of evaluating from the rear surface side of the semiconductor device after the rear surface is processed to become observable. Thus, there is a problem that evaluation is not performed easily.

In a failure analysis in which damage or the like is detected on the upper surface of the object to be measured during the electrical evaluation by use of the photo emission microscopic method, the infrared spectroscopic technique or the like, a plurality of contact probes for electrical connection are disposed on the object to be measured. Therefore, there is a problem that the portion in which infrared radiation or the like is blocked by the contact probes becomes an undetectable region where damage or the like cannot be detected.

Accordingly, the present invention has been made in view of the above problems, and an object thereof is to provide an art capable of suppressing the discharge during the evaluation.

Means for Solving the Problems

The semiconductor device according to the present invention includes a semiconductor base body having an element region and a terminal region adjoining each other in a planar view, a plurality of the electrode pads disposed in an area which is in the element region of the semiconductor base body and is separated from the terminal region, an insulating protection film disposed in the element region and the terminal region of the semiconductor base body and having an opening provided above each of the electrode pads, and a plurality of conductive layers which are disposed on the protection film and are electrically connected respectively with the plurality of electrode pads through the openings. In a planar view, each of the conductive layers is extended to the terminal region or the vicinity of the terminal region.

Further, the method for testing a semiconductor device according to the present invention includes (a) a step of bringing each of a plurality of probes into contact with portions near the terminal region of the plurality of conductive layers and (b) a step of, after the step (a), inputting and outputting electricity to and from the plurality of electrode pads through the plurality of probes and the plurality of conductive layers.

Effects of the Invention

According to the present invention, since the distance between the probes can be lengthened, an electric discharge can be suppressed during the electrical evaluation.

The objects, features, aspects, and advantages of the present invention will become more apparent from the following detailed descriptions and the accompanying drawings.

DESCRIPTION OF PREFERRED EMBODIMENTS

<Preferred Embodiment 1>
<Configuration of the Semiconductor Device>

Figure 1:
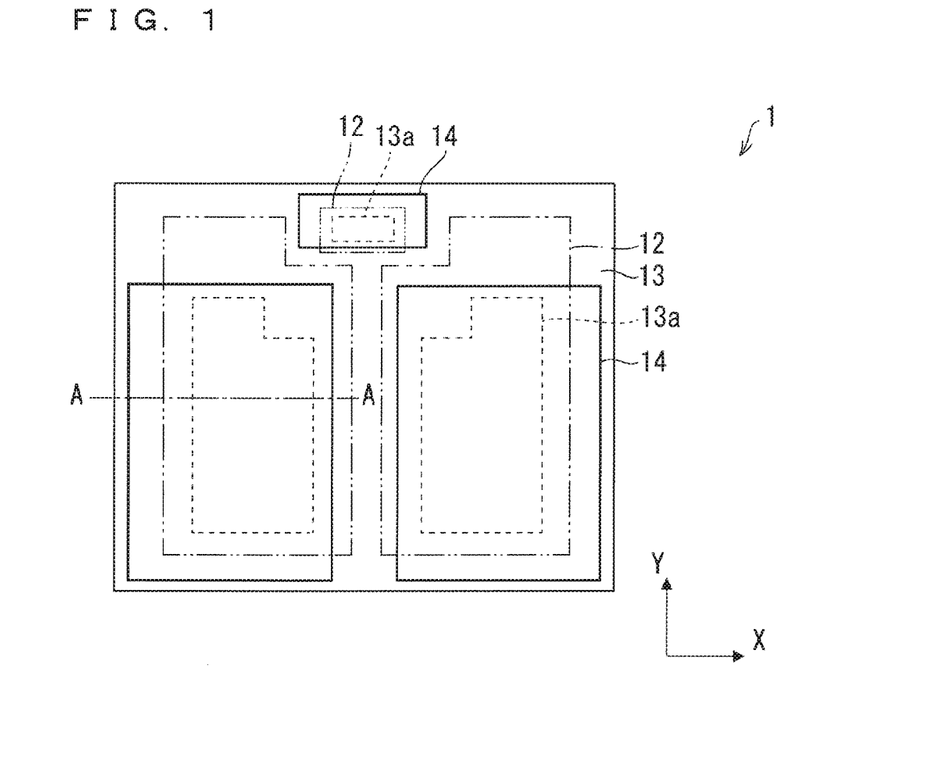
FIG. 1 is a plan view illustrating an overview configuration of a semiconductor device according to Preferred Embodiment 1.
Figure 2:
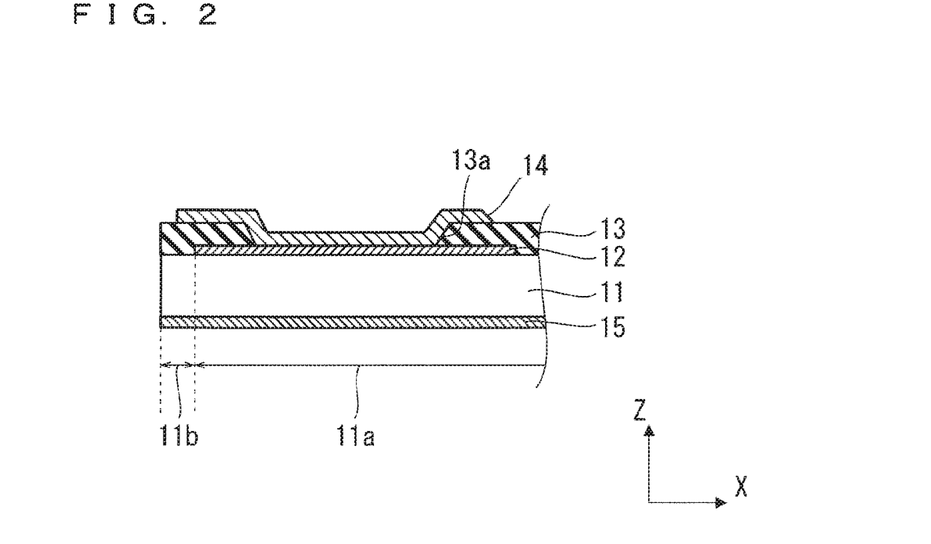
FIG. 2 is a cross-sectional view illustrating the overview configuration of a semiconductor device according to Preferred Embodiment 1.

FIG. 1 is a plan view illustrating an overview configuration of a semiconductor device 1 according to Preferred Embodiment 1 of the present invention, and FIG. 2 is a cross-sectional view taken along line A-A in FIG. 1. Here, as the semiconductor device 1, a semiconductor device of the vertical type structure that turns on or off the high current flowing in the out-of-plane direction in FIG. 1, namely the vertical direction (Z-direction) in FIG. 2 will be described as an example, and particularly, as a semiconductor device of the vertical type structure, an IGBT (Insulated Gate Bipolar Transistor) will be described as an example. However, the semiconductor device 1 according to the present Preferred Embodiment is not limited to the examples, and for example, the semiconductor device 1 may be a semiconductor device other than the IGBT and may be a semiconductor device of the horizontal type structure that is mounted in the horizontal direction.

The semiconductor device 1 illustrated in FIGS. 1 and 2 includes a semiconductor base body 11, a plurality of electrode pads 12 (two emitter electrodes 12a, and one gate electrode 12b) shown by chain double-dashed lines in FIG. 1, an insulating protection film 13 provided with openings 13a shown by broken lines in FIG. 1, a plurality of conductive layers 14, and a collector electrode 15 illustrated in FIG. 2.

Figure 3:
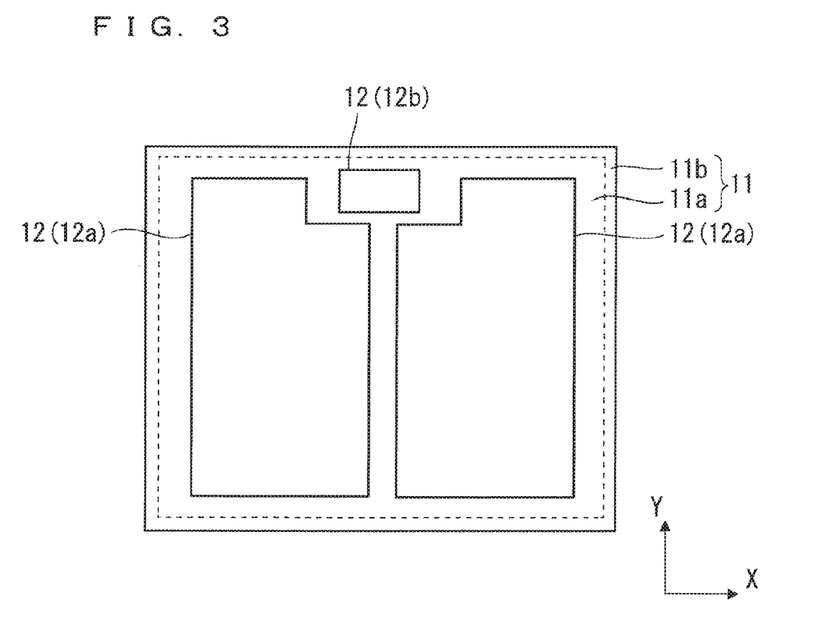
FIG. 3 is a plan view illustrating an overview configuration of a part of a semiconductor device according to Preferred Embodiment 1.

FIG. 3 is a plan view illustrating the semiconductor base body 11 and the plurality of electrode pads 12. The semiconductor base body 11 has an element region 11a and a terminal region 11b adjoining each other in a planar view. Here, the element region 11a is the inner region of a broken line in FIG. 3 and the terminal region 11b is the outer region of the broken line in FIG. 3.

The element region 11a is a region where a desired semiconductor element (here an IGBT) including the plurality of electrode pads 12 and an impurity region (not illustrated) is formed. The terminal region 11b is a region for maintaining voltage resistance of the semiconductor element and others, and formed to surround the element region 11a in a planar view. Here, the description is made on the assumption that the terminal region 11b is formed on the periphery of the semiconductor base body 11.

On the front and rear surfaces of element region 11a of the semiconductor base body 11, to be able to input and output electricity with the exterior, the plurality of electrode pads 12 (emitter electrodes 12a and gate electrode 12b) and the collector electrode 15 are mounted. Incidentally, the positions and numbers of the electrode pads 12 (emitter electrodes 12a and gate electrodes 12b) and the collector electrodes 15 are not limited to those in the configuration illustrated in FIG. 3 and other figures.

Each electrode pad 12 (emitter electrode 12a and gate electrode 12b) is disposed on an area that is in the element region 11a of the semiconductor base body 11 and that is separated from the terminal region 11b. Incidentally, in Preferred Embodiment 1, each electrode pad 12 is assumed to be formed of a transparent conductive film. Further, as is described later, each conductive layer 14 is also assumed to be formed of a transparent conductive film. Thus, when the electrode pads 12 and the conductive layers 14 are formed of transparent conductive films, it is possible to perform evaluation based on a failure analysis (for example, photo emission microscopic method) which has been impossible when the electrode pads 12 and the conductive layers 14 are formed of opaque metal.

Further, in Preferred Embodiment 1, the transparent conductive film may be assumed to include, for example, zinc oxide having a thickness of approximately 3 μm to 5 μm. According to such a configuration, shortening and simplification of the process can be achieved. However, the transparent conductive film is not limited to this, and may include, for example, ITO (Indium Tin Oxide), IZO (Indium Zinc Oxide), and $SnO_2$.

Figure 4:
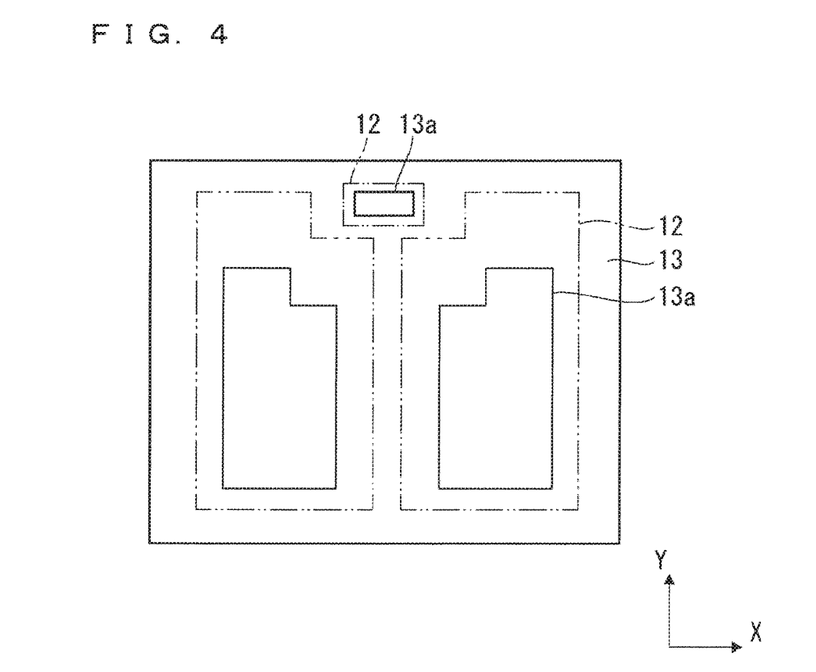
FIG. 4 is a plan view illustrating an overview configuration of a part of a semiconductor device according to Preferred Embodiment 1.

Returning to FIG. 2, the protection film 13 is disposed on the element region 11a and the terminal region 11b of the semiconductor base body 11. FIG. 4 is a plan view showing a configuration obtained by providing the protection film 13 with an insulating characteristic to the configuration illustrated in FIG. 3. Incidentally, in FIG. 4, the contour lines of the electrode pads 12 hidden by the protection film 13 are shown by chain double-dashed lines. Further, in FIG. 4, for simplification of the drawing, the illustration of the boundary line (the broken line in FIG. 3) between the element region 11a and the terminal region 11b is omitted.

As illustrated in FIG. 4, the protection film 13 has one opening 13a provided above each electrode pad 12, and the protection film 13 is disposed on the entire surface of the semiconductor base body 11 excluding the opening 13a.

That is, in the opening 13a, the surface of the electrode pad 12 is exposed from the protection film 13.

In addition, as the material of the protection film 13, in the electrical evaluation, a material is used that has some degree of transparency, is thermally and chemically stable, and is excellent in insulation performance. Specifically, for the material of the protection film 13, for example, a sheet member of polyimides such as Kapton (registered trademark), polyphenyl silsesquioxane or polyvinyl silsesquioxane, or photoresist is applied. However, for the material of the protection film 13, materials other than these materials may be applied.

Thereafter, a pattern is formed by removing or peeling the protection film 13 partially, followed by the subsequent process.

When the protection film 13 is formed from the photoresist, pattern formation is performed by using the ashing process that partially decomposes and removes the photoresist, and the photoresist is subjected to washing as needed. Thus, when the photoresist is applied to the protection film 13, since the protection film 13 can be formed relatively easily by using a general semiconductor process, shortening and cost reduction of the process can be achieved, and in addition, transparency can be added to the protection film 13 to some extent.

On the other hand, in the case of formation of the protection film 13 from the polyimide sheet (sheet member of polyimide), basically the polyimide sheet is partially peeled and removed. Thus, when the polyimide sheet is applied to the protection film 13, since the protection film 13 can be formed relatively easily, shortening and cost reduction of the process can be achieved, and in addition, transparency can be added to the protection film 13 to some extent. Incidentally, when being sent to the mounting process without peeling of the polyimide sheet, the semiconductor device can maintain the discharge suppression effect during the electrical evaluation. Further, when the adhesive layer is provided on the polyimide sheet, it is possible to facilitate the attachment and detachment of the protection film 13.

As will be described in detail in later Preferred Embodiment 3, the protection film 13 may be formed of a plurality of layers made of the same material or different materials.

Returning to FIG. 2, the plurality of conductive layers 14 described above are disposed on the protection film 13, and electrically connected individually to the plurality of electrode pads 12 through the openings 13a. FIG. 1 shows a configuration obtained by providing a plurality of conductive layers 14 to the configuration illustrated in FIG. 3. Incidentally, in FIG. 1, the openings 13a hidden by the conductive layer 14 are shown by broken lines. Further, similarly to FIG. 4, the contour lines of the electrode pads 12 are indicated by chain double-dashed lines, and the boundary line between the element region 11a and the terminal region 11b (the broken line in FIG. 3) is omitted.

As illustrated in FIG. 1, in a planar view, each conductive layer 14 is extended to the terminal region 11b or to the vicinity of the terminal region 11b. Incidentally, in a planar view, the situation in which the conductive layer 14 is extended to the vicinity of the terminal region 11b means that the distance between the conductive layer 14 and the terminal region 11b is, shorter than the distance between the electrode pad 12 electrically connected to the conductive layer 14 and the terminal region 11b.

Furthermore, in a planar view, the configuration in which the conductive layer 14 is extended to the terminal region 11b is assumed to include a configuration in which, in a planar view, the conductive layer 14 is extended to the boundary between the element region 11a and the terminal region 11b and a configuration in which, in a planar view, the conductive layer 14 is extended to the inside of the terminal region 11b beyond the boundary. In Preferred Embodiment 1, as illustrated in FIG. 2, a description is made on the assumption that, in a planar view, each conductive layer 14 is extended to the boundary between the element region 11a and the terminal region 11b. With this configuration, since the distance between the conductive layer 14 and other electrodes through the end face of the semiconductor device 1 (side surface of the semiconductor base body 11) can be lengthened to some extent, an electric discharge or a short circuit between the conductive layer 14 and other electrodes can be suppressed during the electrical evaluation.

As described below, after each contact probe (probe) is brought into contact with a portion of each conductive layer 14 near the terminal region 11b, electricity is input to and output from each electrode pad 12 through each contact probe and each conductive layer 14. By using such input and output of electricity, a test for evaluating the electrical characteristic of the semiconductor device 1 is performed.

As described above, in Preferred Embodiment 1, the conductive layer 14 is assumed to be formed of a transparent conductive film made, for example, of zinc oxide having a thickness of approximately 3 μm to 5 μm; however without being limited thereto, the conductive layer 14 may be formed of a transparent conductive film made, for example, of ITO, IZO and $SnO_2$. Further, the conductive layer 14 may be formed of a plurality of layers made of the same material or different materials, and with this configuration, securing of the electrical conductivity and suppression of heat generation caused by reducing the current density can be expected.

The transparent conductive film to be used for the conductive layer 14 is formed using, for example, sputtering or the like. When photoresist is applied to the protection film 13, it is considered difficult to perform the sputtering of the conductive layer 14 by using a photoresist capable of fine pattern forming as a mask. However, in general, since the region of the conductive layer 14 is relatively large, even if a photoresist is not used, by sputtering using a metal mask that allows a certain degree of pattern formation, it is possible to selectively form the conductive layer 14. Also, when the fine pattern formation on the conductive layer 14 is required, by applying a sheet member to the protection film 13 and sputtering using a photoresist as a mask, the conductive layer 14 may be formed.

Further, before the conductive layer 14 is formed, the upper surface of the electrode pad 12 may be roughened. Thus, adhesion and contact resistance between the electrode pad 12 and the conductive layer 14 can be secured. As a method of roughening, for example, mild etching or a short-time sandblast of the electrode pads 12 can be applied.

<Configuration of the Semiconductor Evaluation Apparatus>

Figure 5:
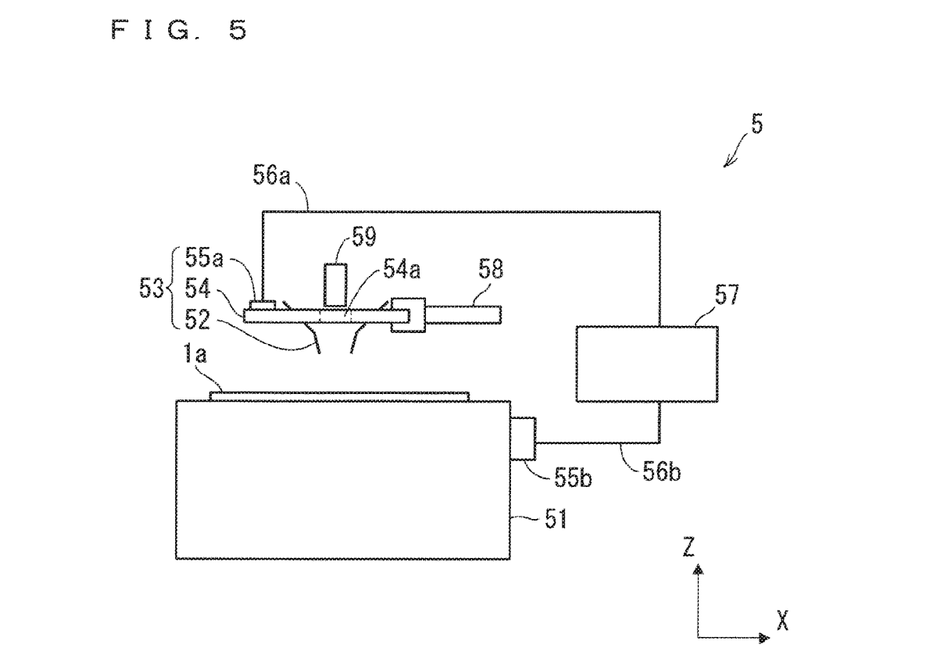
FIG. 5 is a side view illustrating an overview configuration of a semiconductor evaluation apparatus according to Preferred Embodiment 1.

FIG. 5 is a side view showing an overview configuration of a semiconductor evaluation apparatus 5 for evaluating the electrical characteristic of the semiconductor device 1 of the vertical type structure as described above. Here, it is assumed that the semiconductor evaluation apparatus 5 evaluates the electrical characteristics of a plurality of semiconductor devices 1 formed in a single wafer 1a for each one of the semiconductor devices 1.

The semiconductor evaluation apparatus 5 has a chuck stage 51, which is a pedestal for fixing the wafer 1a by being in contact with the mounting surface of the wafer 1a (rear surface on which the collector electrode 15 is disposed in this case). Here, it is assumed that for the fixing means of the chuck stage 51 (holding means), a vacuum suction for example is applied. However, this fixing means is not limited to the vacuum suction, and electrostatic attraction for example may be applied.

An electrode in contact with the electrode pad 12 when the electrical characteristic of the semiconductor device 1 is evaluated is a contact probe 52. Here, a plurality of contact probes 52 are provided on the assumption that a high current is applied thereto. Further, the contact probe 52 is provided in a probe base body 53, and the probe base body 53 has an insulating base body 54 and a connecting portion 55a in addition to the contact probe 52.

The contact probe 52 is mechanically connected to the insulating base body 54, and a connecting portion 55a is disposed on the insulating base body 54. On an insulating base body 54, a metal wiring (not illustrated), for example, is formed, and the contact probe 52 is electrically connected to the connecting portion 55a via the metal wiring. The connecting portion 55a is electrically connected through a signal line 56a to an evaluation unit (control unit) 57. According to the above configuration, the contact probe 52 is electrically connected to the evaluation unit 57 through the metal wiring provided on the insulating base body 54, the connecting portion 55a, and the signal line 56a.

The semiconductor evaluation apparatus 5 is provided with, as an electrode in contact with the collector electrode 15 when the electrical characteristic of the semiconductor device 1 is evaluated, an electrode (not illustrated) formed on the upper surface of the chuck stage 51. The electrode is electrically connected to the connecting portion 55b provided on a side surface of the chuck stage 51. The connecting portion 55b is electrically connected through a signal line 56b to the evaluation unit (control unit) 57. According to the above configuration, the electrode formed on the upper surface of the chuck stage 51 is electrically connected through the connecting portion 55b and the signal line 56b to the evaluation unit 57.

The arrangement positions of the connecting portion 55a which defines the connecting position between the signal line 56a and the insulating base body 54 and the connecting portion 55b provided on the side surface of the chuck stage 51 are designed, such that the distance between the connecting portions 55a and 55b is substantially constant, through any contact probe 52. According to such a configuration, the density of the current applied to each contact probe 52 can be made substantially equal.

A probe base body 53 including the contact probe 52, the insulating base body 54, and the connecting portion 55a is movable in any direction by a moving arm 58. As a matter of course, instead of moving the probe base body 53, the wafer 1a, namely the chuck stage 51 may be moved. By such movement, a plurality of contact probes 52 can be brought into contact with the plurality of electrode pads 12 of the semiconductor device 1 on the chuck stage 51.

In Preferred Embodiment 1, a through hole 54a is provided in the insulating base body 54 (the probe base body 53), and a detector/camera 59 used for the analysis is mounted above the through hole 54a. According to such a configuration, a failure analysis can be performed in which damage is detected on the upper surface of the semiconductor device 1 (object to be measured) during the electrical evaluation, by use of a photo emission microscope, an infrared spectroscopy or the like.

<Method for Testing the Semiconductor Device>

Figure 6:
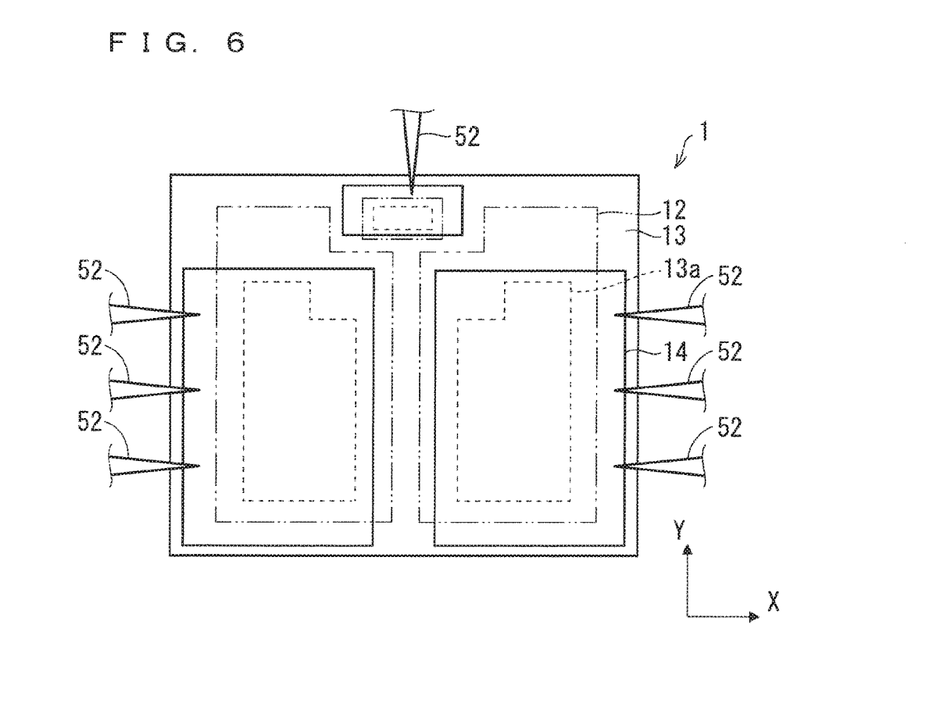
FIG. 6 is a plan view for explaining a method for testing a semiconductor device according to Preferred Embodiment 1.

FIG. 6 is a top view for explaining a method for testing the semiconductor device 1 according to Preferred Embodiment 1. Incidentally, in Preferred Embodiment 1, as described above, the evaluation of electrical characteristics of a plurality of semiconductor devices 1 formed in the single wafer 1a is performed for each one of the semiconductor devices 1.

As illustrated in FIG. 6, each of the plurality of contact probes 52 is brought into contact with a portion of each of the plurality of conductive layers 14, which is near the terminal region 11b. In Preferred Embodiment 1, each contact probe 52 is brought into contact with a portion in each of conductive layers 14, which is closer to the terminal region 11b than the electrode pads 12 electrically connected to the conductive layers 14.

Then, after contact of the contact probe 52, by inputting and outputting electricity to and from the plurality of electrode pads 12 through a plurality of contact probes 52 and a plurality of conductive layers 14, a test for evaluating the electrical characteristic of the semiconductor device 1 is performed. In addition, here, by bringing a plurality of contact probes 52 into contact with one conductive layer 14, a high current can be applied.

<Effect>

According to the semiconductor device and the method for testing the semiconductor device according to Preferred Embodiment 1 as described above, the distance between the contact probes 52 when the contact probes 52 are brought into contact with the conductive layers 14 is longer than the distance between the contact probes 52 when the contact probes 52 are brought into contact with the electrode pads 12. Accordingly, since the distance between the contact probes 52 can be lengthened, an electric discharge during the electrical evaluation can be suppressed.

Incidentally as illustrated in FIG. 1, in a planar view, the distance between any two conductive layers 14 is preferably made to be greater than the distance between the two electrode pads 12 electrically connected to the two conductive layers 14 respectively. According to such a configuration, since the distance between the two electrode pads 12 can be substantially lengthened, the electric discharge during the electrical evaluation can be suppressed.

<Modifications>

In Preferred Embodiment 1, two emitter electrodes 12a are configured so as to be electrically connected respectively with two conductive layers 14 separated from each other. That is, the emitter electrode 12a and the conductive layer 14 are formed on a one-to-one basis. However, when the two emitter electrodes 12a have basically the same potential, the two emitter electrodes 12a (some predetermined electrode pads 12) may be electrically connected (coupled) to each other by one conductive layer 14. According to this configuration, selectivity of the area becomes easy, and simplification of the process can be expected. In addition, the effect of suppressing current concentration and thus suppressing heat generation during the electrical evaluation can also be expected.

Moreover, in the method for testing the semiconductor device 1 according to Preferred Embodiment 1, the evaluation of the electric characteristics of a plurality of semiconductor devices 1 formed in one wafer 1a is performed for each one of the semiconductor device 1. However, the method is not limited to this, and after the contacting process of the contact probes 52 is performed uniformly on the plurality of semiconductor devices 1 (for example, all of the semiconductor devices 1) formed in one wafer 1a, the process of inputting and outputting electricity may be performed uniformly on the plurality of semiconductor devices 1. According to such a configuration, shortening of the process, improvement of the throughput, and reduction in the test cost can be achieved.

Further, in the above description, the semiconductor device 1 may further include at least any one of a first barrier metal (not illustrated) disposed under the electrode pad 12, and a second barrier metal (not illustrated) disposed under the conductive layer 14. According to such a configuration, an electrode material such as a transparent conductive film can be prevented from extending to a deep portion of the element region 11*a*. The first and second barrier metals may be members made of tungsten silicide (WSi) having a thickness of approximately 50 nm to 200 nm, for example. According to such a configuration, the effect of the barrier metal can be enhanced.

Besides, the semiconductor device 1 according to Preferred Embodiment 1 is configured such that the protection film 13 finally remains. However, the protection film 13 has only to be present during the evaluation, and thus the protection film 13 may be removed by ashing or peeling after the evaluation. Further, after removing the transparent conductive film in conjunction with the removal of the protection film 13, an electrode pad (not illustrated) may be formed of non-transparent metal as a component. Accordingly, a long-term stability can be achieved and the subsequent process can be facilitated.

In addition, the modification examples of Preferred Embodiment 1 have been described above, and the modifications may be applied to Preferred Embodiments described later.

<Preferred Embodiment 2>

Figure 7:
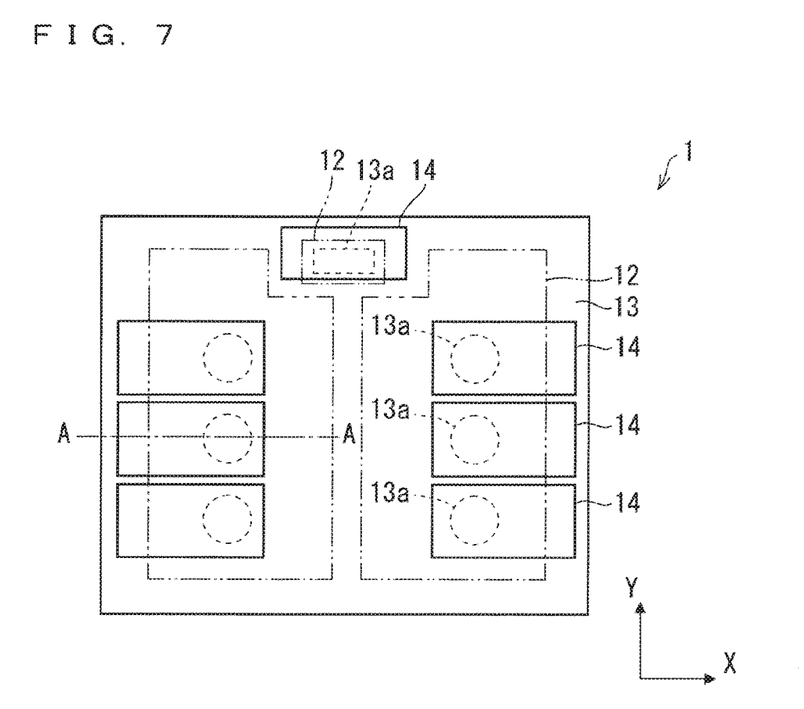
FIG. 7 is a plan view illustrating an overview configuration of a semiconductor device according to Preferred Embodiment 2.
Figure 8:
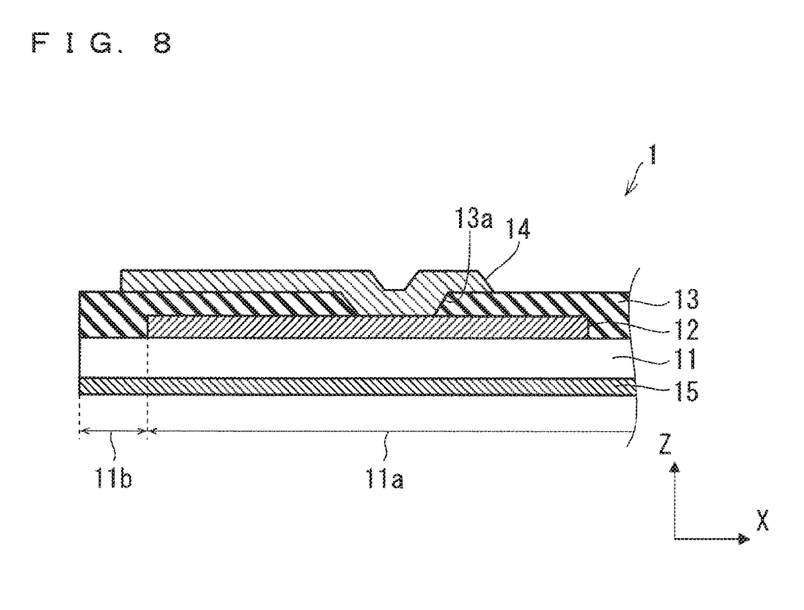
FIG. 8 is a cross-sectional view illustrating the overview configuration of a semiconductor device according to Preferred Embodiment 2.

FIG. 7 is a plan view showing an overview configuration of a semiconductor device 1 according to Preferred Embodiment 2 of the present invention, and FIG. 8 is a cross-sectional view taken along line A-A in FIG. 7. Incidentally, in the semiconductor device 1 according to Preferred Embodiment 2, components identical or similar to components described above are denoted by the same reference numerals, and difference will be mainly described.

As illustrated in FIG. 7, in Preferred Embodiment 2, corresponding to each electrode pad 12 (emitter electrode 12*a* in this case), a plurality of openings 13*a* (here, three openings) are provided on the protection film 13. Further, one conductive layer 14 is disposed corresponding to each of the plurality of openings 13*a* (here, all the three openings) which are provided corresponding to one electrode pad 12.

Figure 9:
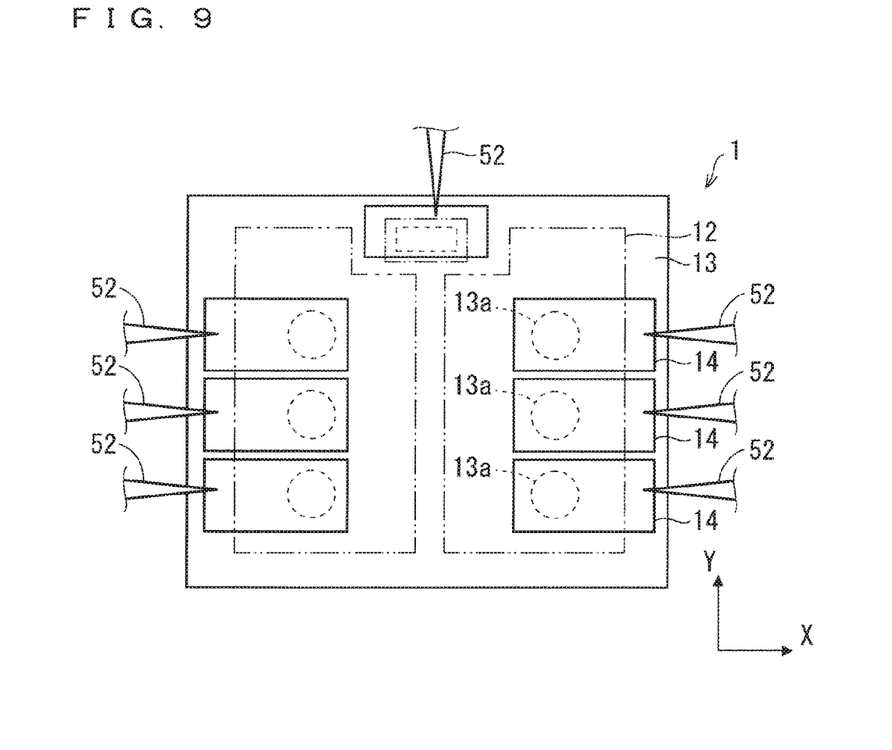
FIG. 9 is a plan view for explaining a method for testing a semiconductor device according to Preferred Embodiment 2.

FIG. 9 is a top view for explaining a method for testing a semiconductor device 1 according to Preferred Embodiment 2. As illustrated in FIG. 9, in Preferred Embodiment 2, by bringing a contact probe 52 into contact with the conductive layer 14 on a one-to-one basis, a high current can be applied.

According to the semiconductor device 1 and the method for testing the semiconductor device 1 according to Preferred Embodiment 2 described above, it is possible not only to obtain similar effects as in Preferred Embodiment 1, but also to suppress the current concentration during the electrical evaluation, and thus the heat generation due to the current can be suppressed.

In the exemplary configuration illustrated in FIG. 9, in order to input and output electricity to and from one of the emitter electrodes 12*a* through three contact probes 52, three openings 13*a* and three conductive layers 14 are provided. However, the numbers of the openings 13*a* and the conductive layers 14 are not limited to three. For example, in response to the size of the electrode pad 12 made of a transparent conductive film, the input and output current, etc., and further the number of contact probes 52, the numbers of openings 13*a* and the conductive layers 14 may be increased or decreased.

<Preferred Embodiment 3>

In the previous Preferred Embodiments, the semiconductor device 1 is provided with the protection film 13 composed of one layer; however in Preferred Embodiment 3 of the present invention, the semiconductor device 1 is provided with an insulating protection film composed of a plurality of layers.

Figure 10:
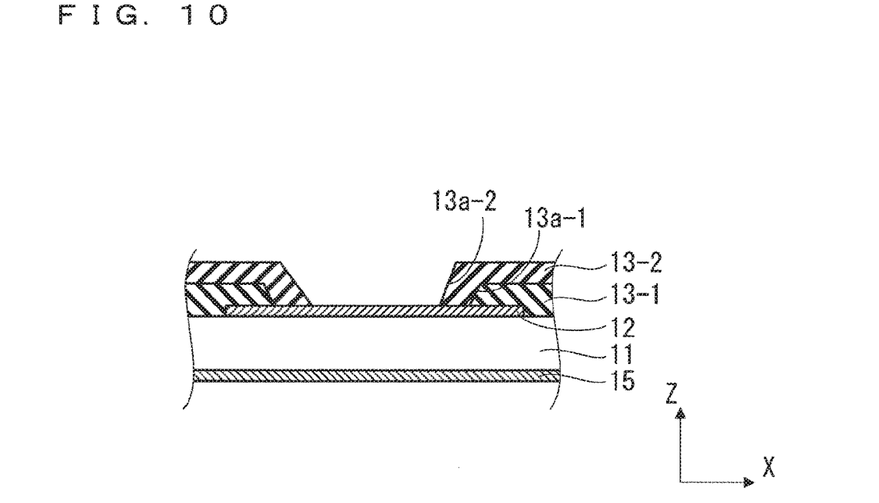
FIG. 10 is a cross-sectional view illustrating an overview configuration of a semiconductor device according to Preferred Embodiment 3.

FIG. 10 is a cross-sectional view showing an overview configuration of a semiconductor device 1 according to Preferred Embodiment 3 of the present invention. In addition, in the semiconductor device 1 according to Preferred Embodiment 3, components identical or similar to the components described above are denoted by the same reference numerals, and difference will be mainly described. Moreover, although the semiconductor device according to Preferred Embodiment 3 is also provided with the conductive layer 14, the illustration of the conductive layer 14 is omitted for simplicity in FIG. 10.

As illustrated in FIG. 10, on the insulating protection film 13-1, a protection film 13-2 of an insulating layer is laminated. The protection films 13-1 and 13-2 may be formed of the same material or different material. For example, the above-described sheet member may be applied to the protection film 13-1, and a photoresist may be applied to the protection film 13-2.

Further, as illustrated in FIG. 10, an opening 13*a*-1 of the protection film 13-1 of the lower layer may be formed to be larger than the opening 13*a*-2 of the protection film 13-2 of the upper layer, and a subsequent process may be performed after the removal of only the protection film 13-2 of the upper layer after the electrical evaluation, while the protection film 13-1 of the lower layer is left. Thus, in a subsequent process, for example wire bonding requiring a relatively large opening can be easily performed.

Further, arrangement is desirable in which the protection film 13-1 formed in a preceding process is covered with the protection film 13-2 formed in a succeeding process. According to this configuration, the excessive difference in level can be suppressed, and the conductive layer 14 that is integrated indiscretely can be easily formed.

According to the semiconductor device 1 and the method for testing the semiconductor device 1 according to Preferred Embodiment 3 as described above, the effects similar to those of Preferred Embodiment 1 can be enhanced by using the protection film composed of a plurality of layers. Further, the efficiency of partial removal of the protection film can be increased.

Figure 11:
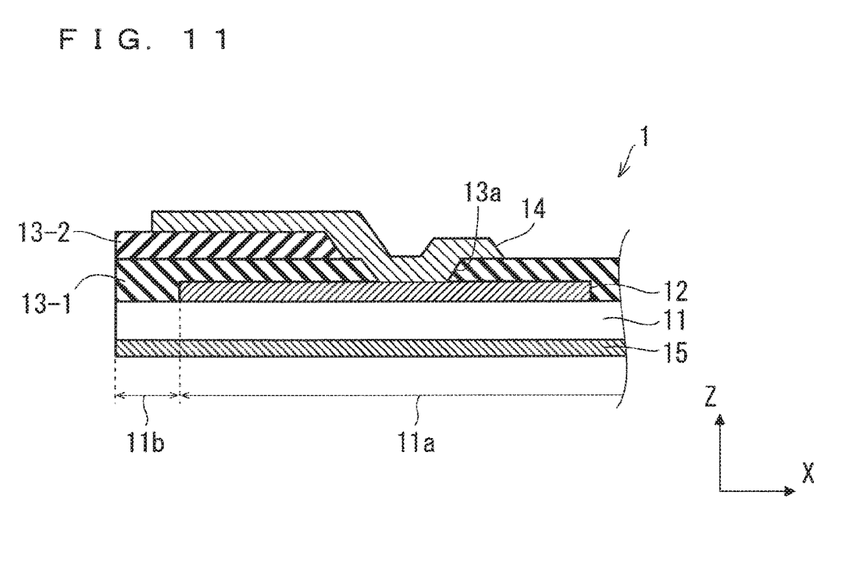
FIG. 11 is a cross-sectional view illustrating the overview configuration of a semiconductor device according to Preferred Embodiment 3.

In addition, it is known that a partial discharge occurs not only in the element region 11*a* as an active region (central part of the semiconductor device 1) with which the contact probe 52 is brought into contact, but also in the vicinity of the outer peripheral portion where the terminal region 11*b* is formed. Therefore, as illustrated in FIG. 11, only within the vicinity of the terminal region 11*b*, a protection film composed of the protection film 13-1 and the protection film 13-2 thereon may be formed. With this configuration, since the distance between the conductive layer 14 and other electrodes through the end face of the semiconductor device 1 (side surface of the semiconductor base body 11) can be lengthened to some extent, a discharge or a short circuit between the conductive layer 14 and other electrodes can be suppressed during the electrical evaluation.

In the above description, although the configuration in which the protection film is composed of two layers (the protection films 13-1 and 13-2) has been described, the protection film may be composed of three or more layers.

In addition, the present invention, within the scope of the present invention, can combine respective Preferred Embodiments freely and can modify or omit each Preferred Embodiment appropriately.

While the present invention has been described in detail, the above description is illustrative in all aspects, and the present invention is not limited thereto. It is understood that numerous modifications whose examples are not described are conceivable without departing from the scope of the present invention.

REFERENCE SIGNS LIST

1: semiconductor device
11: semiconductor base body
11a: element region
11b: terminal region
12: electrode pad
12a: emitter electrode
13, 13-1, 13-2: protection film
13a, 13a-1, 13a-2: opening
14: conductive layer
52: contact probe

The invention claimed is:

1. A semiconductor device comprising:
a semiconductor base body including an element region and a terminal region adjoining the element region in a planar view;
a plurality of electrode pads disposed in an area in said element region of said semiconductor base body, the area being separated from said terminal region;
an insulating protection film disposed in said element region and said terminal region of said semiconductor base body and having an opening provided above each of said plurality of electrode pads; and
a plurality of conductive layers which are disposed on said protection film and are electrically connected respectively with said plurality of electrode pads through said opening,
wherein each of said plurality of conductive layers is extended to said terminal region or a vicinity of said terminal region in a planar view, and
a ratio of a total number of conductive layers to a total number of electrode pads is 1 to 1.

2. The semiconductor device according to claim 1, wherein
a plurality of said openings are provided, in said protection film, corresponding to each of said plurality of electrode pads.

3. The semiconductor device according to claim 2, wherein
each of said plurality of conductive layers is disposed corresponding to each of said plurality of openings provided corresponding to one of said plurality of electrode pads.

4. The semiconductor device according to claim 1, wherein
some predetermined electrode pads of said plurality of electrode pads are electrically connected to each other by one of said plurality of conductive layers.

5. The semiconductor device according to claim 1, wherein
each of said plurality of conductive layers is extended to a boundary between said element region and said terminal region in a planar view.

6. The semiconductor device according to claim 1, wherein
a distance between any two of said plurality of conductive layers is greater than a distance between two of said plurality of electrode pads electrically connected respectively to said two of said plurality of conductive layers in a planar view.

7. The semiconductor device according to claim 1, wherein
said plurality of electrode pads and said plurality of conductive layers are formed of transparent conductive films.

8. The semiconductor device according to claim 7, wherein
said transparent conductive films include zinc oxide.

9. The semiconductor device according to claim 1, wherein
said protection film includes a plurality of layers made of an identical material or different materials.

10. The semiconductor device according to claim 1, wherein
said protection film includes a photoresist or a polyimide sheet.

11. The semiconductor device according to claim 10, wherein
when said protection film includes a polyimide sheet, said polyimide sheet is provided with an adhesive layer.

12. The semiconductor device according to claim 1, further comprising
at least one of a first barrier metal disposed under said plurality of electrode pads and a second barrier metal disposed under said plurality of conductive layers.

13. The semiconductor device according to claim 12, wherein
said first and second barrier metals include tungsten silicide (WSi).

14. A method for testing a semiconductor device, the semiconductor device comprising:
a semiconductor base body including an element region and a terminal region adjoining the element region in a planar view;
a plurality of electrode pads disposed in an area in said element region of said semiconductor base body, the area being separated from said terminal region;
an insulating protection film disposed in said element region and said terminal region of said semiconductor base body and having an opening provided above each of said plurality of electrode pads; and
a plurality of conductive layers which are disposed on said protection film and are electrically connected respectively with said plurality of electrode pads through said opening,
wherein each of said plurality of conductive layers is extended to said terminal region or a vicinity of said terminal region in a planar view,
the method comprising the steps of:
(a) bringing a plurality of probes into contact with portions of said plurality of conductive layers respectively, the portions being located near said terminal region; and
(b) inputting and outputting electricity to and from said plurality of electrode pads through said plurality of probes and said plurality of conductive layers after said step (a).

15. The method for testing the semiconductor device according to claim 14, wherein
said step (a) is performed uniformly on a plurality of semiconductor devices formed in one wafer, and then said step (b) is performed uniformly on said plurality of semiconductor devices.

* * * * *